(12) United States Patent
Wang et al.

(10) Patent No.: US 11,362,272 B2
(45) Date of Patent: Jun. 14, 2022

(54) RESISTIVE MEMORY DEVICE AND RELIABILITY ENHANCEMENT METHOD THEREOF BY USING RATIO OF SET CURRENT AND REFERENCE CURRENT

(71) Applicant: Winbond Electronics Corp., Taichung (TW)

(72) Inventors: Ping-Kun Wang, Taichung (TW);
Chia-Wen Cheng, Taichung (TW);
He-Hsuan Chao, Taichung (TW);
Frederick Chen, San Jose, CA (US);
Chang-Tsung Pai, Taichung (TW);
Tzu-Yun Huang, Taichung (TW);
Ming-Che Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 74 days.

(21) Appl. No.: 17/002,759

(22) Filed: Aug. 25, 2020

(65) Prior Publication Data
US 2022/0069209 A1    Mar. 3, 2022

(51) Int. Cl.
*H01L 27/24* (2006.01)
*G11C 29/50* (2006.01)
*H01L 45/00* (2006.01)
*G11C 13/00* (2006.01)

(52) U.S. Cl.
CPC ...... *H01L 45/1226* (2013.01); *G11C 13/0002* (2013.01); *G11C 29/50* (2013.01); *H01L 27/24* (2013.01); *H01L 45/16* (2013.01); *G11C 2029/5006* (2013.01)

(58) Field of Classification Search
CPC ..... H01L 45/1226; H01L 45/16; H01L 27/24; G11C 13/0002; G11C 29/50; G11C 2029/5006
See application file for complete search history.

(56) References Cited

U.S. PATENT DOCUMENTS 9,443,587 B1    9/2016   Chen et al.
10,170,184 B1   1/2019   Wang et al.
(Continued)

FOREIGN PATENT DOCUMENTS

CN    103003884 A  *  3/2013  .......... G11C 13/004

OTHER PUBLICATIONS

P.Huang, et al., "A Physical Based Analytic Model of RRAM Operation for Circuit Simulation." 2012 IEDM, Dec. 10-13, 2012, pp. 605-608.

*Primary Examiner* — Sultana Begum
(74) *Attorney, Agent, or Firm* — JCIPRNET (57) ABSTRACT

A resistive memory device and a reliability enhancement method thereof are provided. The reliability enhancement method includes the following steps. A forming operation is performed on a plurality of memory cells. The formed memory cells are read to respectively obtain a plurality of formed currents. A reference current is set according to a statistic value of the formed currents. A setting operation is performed on the memory cells. A ratio between a set current of each of the memory cells and the reference current is calculated, and a physical status of each of the memory cells is judged according to the ratio. It is determined whether to perform a fix operation of each of the memory cells or not according to physical status.

14 Claims, 5 Drawing Sheets

(56) References Cited

U.S. PATENT DOCUMENTS

| | | | | |
|---|---|---|---|---|
| 2010/0124125 A1* | 5/2010 | Amanai | ............... | G11C 16/28 365/185.21 |
| 2013/0070528 A1* | 3/2013 | Maeda | ............... | G11C 16/08 365/185.11 |

* cited by examiner

RESISTIVE MEMORY DEVICE AND RELIABILITY ENHANCEMENT METHOD THEREOF BY USING RATIO OF SET CURRENT AND REFERENCE CURRENT

BACKGROUND

Technical Field

The disclosure relates to a resistive memory device and a reliability enhancement method thereof, and more particularly to a reliability enhancement method of data retention of a resistive memory device.

Description of Related Art

With the advancement of electronic technology, it is an essential function for a modern electronic device to provide high-reliability data retention capability. In a resistive memory, when data is read on memory cells, a reference current is often compared with a reading current of the memory cells to thereby obtain the data retained in the memory cells.

Figure 1:
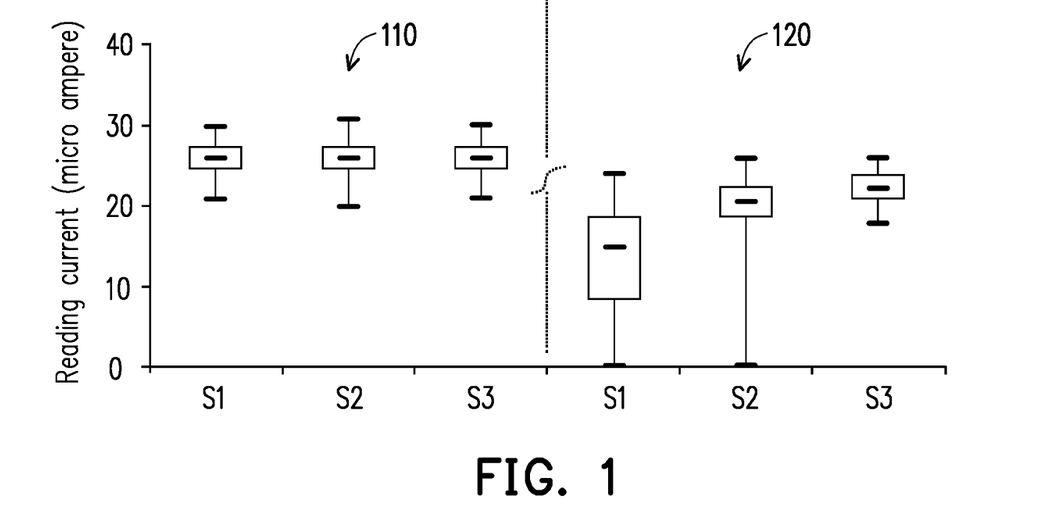
FIG. 1 is a distribution relationship diagram of setting conditions of resistive memory cells and a set current.

The reference current is generally set to be a constant current, so after the memory cells are set or reset, a reading current being provided needs to have certain uniformity. Otherwise, wrong data may be read in a reading operation performed on the memory cells. In a distribution relationship diagram of setting conditions of resistive memory cells and a set current in FIG. 1, in a before-baking status 110, three different set statuses S1-S3 are corresponded. The reading current distribution of the memory cells has relatively high uniformity, and may be uniformly distributed in an interval of about 20-32 micro amperes. However, in an after-baking status 120, the reading current distribution of the memory cells corresponding to three different set statuses S1-S3 undergoes variations. The reading current distribution of the memory cells corresponding to the set statuses S1 and S2 is seriously scattered. Therefore, the possibility of occurrence of errors of a reading operation is greatly increased.

SUMMARY

The invention provides a resistive memory device and a reliability enhancement method thereof, which can effectively enhance data reliability of memory cells thereof.

The reliability enhancement method of the invention includes the following steps. A forming operation is performed on a plurality of memory cells. The formed memory cells are read to respectively obtain a plurality of formed currents. A reference current is set according to a statistic value of the plurality of formed currents. A setting operation is performed on the memory cells. A ratio between a set current of each of the memory cells and the reference current is calculated, and a physical status of each of the memory cells is judged according to the ratio. It is determined whether to perform a fix operation of each of the memory cells or not according to the physical status of each of the memory cells.

The resistive memory device of the invention includes a memory cell array, a sensing amplifier and a controller. The memory cell array includes a plurality of memory cells. The sensing amplifier is coupled to the memory cell array. The controller is coupled to the sensing amplifier, and is configured to perform the above reliability enhancement method.

Based on the above, the physical status of each of the memory cells in the resistive memory device is judged according to a ratio of a set current of the memory cells to a maximum value of the formed current, and a subsequent fix operation is performed according to the physical status of each of the memory cells, so that the reliability of the memory cells can be effectively enhanced.

DESCRIPTION OF THE EMBODIMENTS

Figure 2:
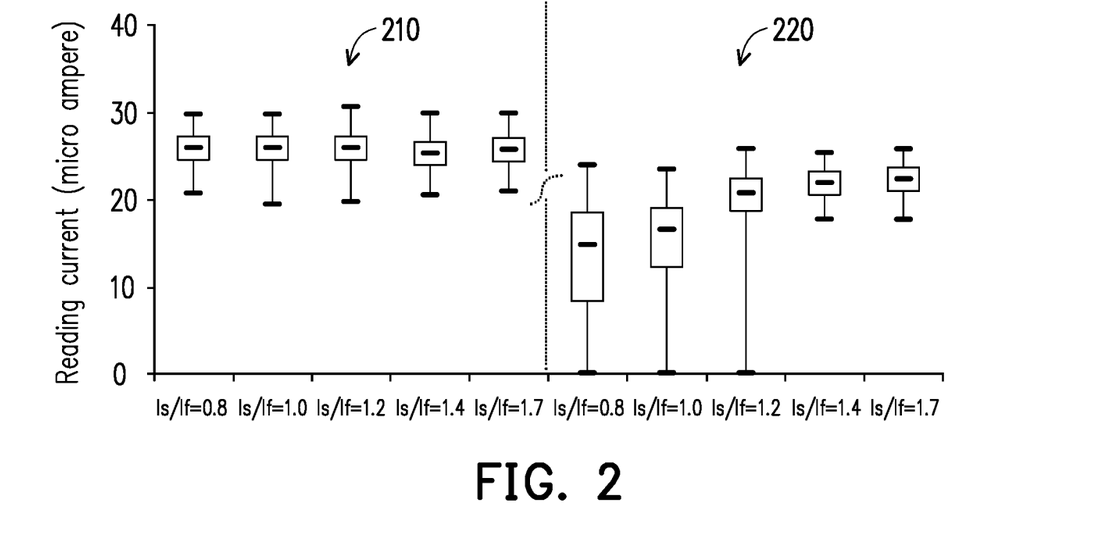
FIG. 2 is a distribution diagram of resistive memory cells corresponding to reading currents of memory cells under different conditions.

Referring to FIG. 2 at first, FIG. 2 is a distribution diagram of resistive memory cells corresponding to reading currents of memory cells under different conditions. In FIG. 2, a horizontal axis represents a ratio Is/If of a set current Is after a setting operation on the memory cells to a formed current If after a forming operation on the memory cells. A longitudinal axis is reading current distribution (unit: micro ampere) of the memory cells. In FIG. 2, in a before-baking status 210, various conditions (different radios Is/If) are corresponded. The reading current distribution of all the memory cells may have relatively high uniformity. However, in an after-baking status 220, relatively high ratios (Is/If≥1.4) are corresponded, and the reading current distribution of the memory cells may have relatively high uniformity. Therefore, it can be known that physical characteristics of the memory cells may be judged according to the ratios of the set currents Is and the formed currents If, and may be used as a fix basis of the memory cells.

Figure 3:
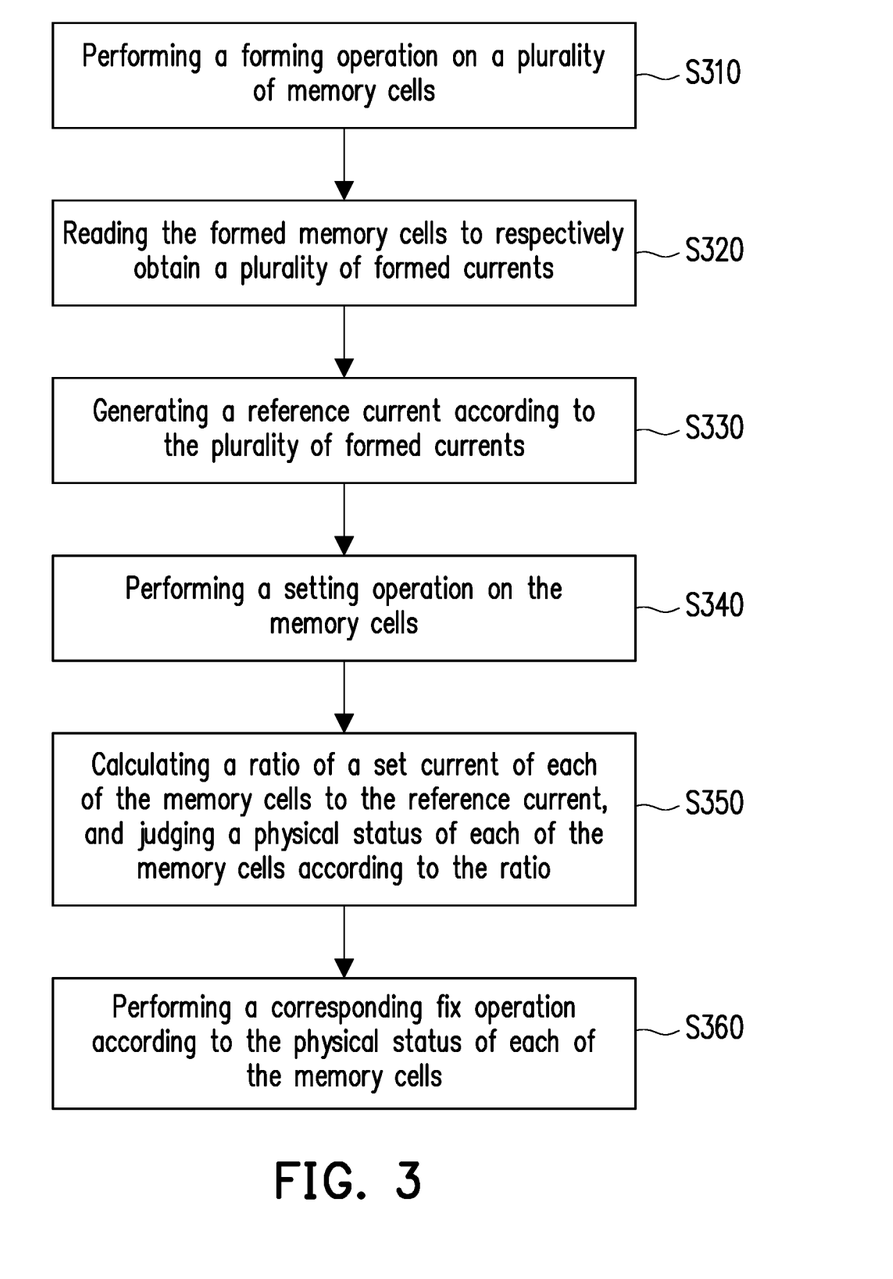
FIG. 3 shows a flow diagram of a reliability enhancement method of an embodiment of the invention.

Referring to FIG. 3 hereafter, FIG. 3 shows a flow diagram of a reliability enhancement method of an embodiment of the invention. The reliability enhancement method is applicable to a resistive memory. In FIG. 3, in step S310, a forming operation is performed on a plurality of memory cells in the memory. Herein, an initialization operation performed on the resistive memory cells is called as the forming operation. In the forming operation, bias needs to be applied to the memory cells. When an electric field exceeds a critical value, a dielectric layer of the resistive memory cells may generate a collapse-like phenomenon, so that the dielectric layer changes from a high-resistance-value insulation status into a convertible-resistance-value status. A resistance value of the dielectric layer of the memory cells completing the forming operation can be subsequently and effectively decreased or increased through a setting operation or a resetting operation, and a data retention effect is generated.

In step S320, the formed memory cells are read, and a plurality of formed currents are respectively obtained. Then, in step S330, a reference current is generated according to the plurality of formed currents. In an embodiment, the reference current may be generated according to a statistic value (such as a maximum value, an average value and a median) of a plurality of formed currents. In other embodiments, the reference current may also be generated according to an average value and a median of a plurality of formed currents. Generally, the reference current may equal to a maximum one of the formed currents.

In step S340, the setting operation is performed on the memory cells. In step S350, a reading operation is performed on each of the memory cells completing the setting operation to obtain a plurality of set currents of the memory cells, the ratios of the set currents to the reference current generated in step S330 are calculated, and the physical status of each of the corresponding memory cells is judged according to each ratio. Next, in step S360, a corresponding fix operation is performed according to the physical status of each of the memory cells.

It should be noted that basically, a resistance value of the memory cells may be further decreased by performing the setting operation on the formed memory cells. That is, in a normal status, the ratio of the set currents to the reference current is greater than 1. Additionally, according to FIG. 2, it can be known that the physical status of the memory cells may be known according to the ratios of the set currents to the reference current. For example, when the ratio Is/If<1.4 (i.e., the set current is smaller than 1.4*reference current), the reading current distribution after memory cell baking is easy to scatter. When the ratio Is/If≥1.4, the reading current distribution after memory cell baking is more concentrated. Based on FIG. 2, in the embodiment of the invention, a plurality of reference values may be set to be used as the basis for judging the physical status of the memory cells.

For example, in the embodiment of the invention, a first reference value, a second reference value and a third reference value may be set. 1<the first reference value<the second reference value<the third reference value. In step S350, when the ratio of the set current corresponding to the memory cells to the reference current is in a range of 1 to the first reference value, the memory cells belong to defective memory cells. Therefore, the memory cells may be fixed in step S360 by backup memory cells, or data retained in the memory cells are recorded, and an error correction code operation is performed to fix the memory cells, or the memory cells are set as failed.

When the ratio of the set current corresponding to the memory cells to the reference current is in a range of the first reference value to the second reference value, the memory cells belong to dangerous memory cells, so that an additional small insert reset pulse (SIRP) operation may be performed on the memory cells in step S360 to fix the memory cells and improve the ratio of the set currents to the reference current. A special mention made here is that for the SIRP operation, after set pulses (or forming pulses) are applied to the memory cells, reset pulses with a relatively low voltage value (the voltage value relative to the set pulses/forming pulses) are properly inserted, and then, the set pulses (or forming pulses) are applied again. Therefore, the resistance value of this kind of memory cells can be effectively decreased, and their set currents (or formed currents) are improved.

When the ratio of the set current corresponding to the memory cells to the reference current is in a range of the second reference value to the third reference value, the memory cells may be directly judged to be safe memory cells, and the fix operation does not need to be performed.

When the ratio of the set current corresponding to the memory cells to the reference current is greater than the third reference value, the memory cells are also safe memory cells, and the fix operation does not need to be performed. However, as the ratio is greater than the third reference value, it represents that when the memory cells perform a setting operation, the resistance value is decreased to a lower range, so that when the resetting operation is performed on the memory cells in subsequent steps, an enhanced resetting operation (for example, resetting is performed by higher energy) may be needed. Therefore, the memory cells may be recorded as memory cells requiring enhanced resetting.

Incidentally, it is mentioned that the physical status of each of the memory cells may be obtained by setting a plurality of corresponding marking values. For example, by corresponding to four possible physical statuses, each of the memory cells may have corresponding two-bit marking values. When the setting, resetting or reading operation is performed on each of the memory cells, the corresponding fix operation may be performed according to the corresponding marking value of each of the memory cells to enhance data reliability.

Figure 4:
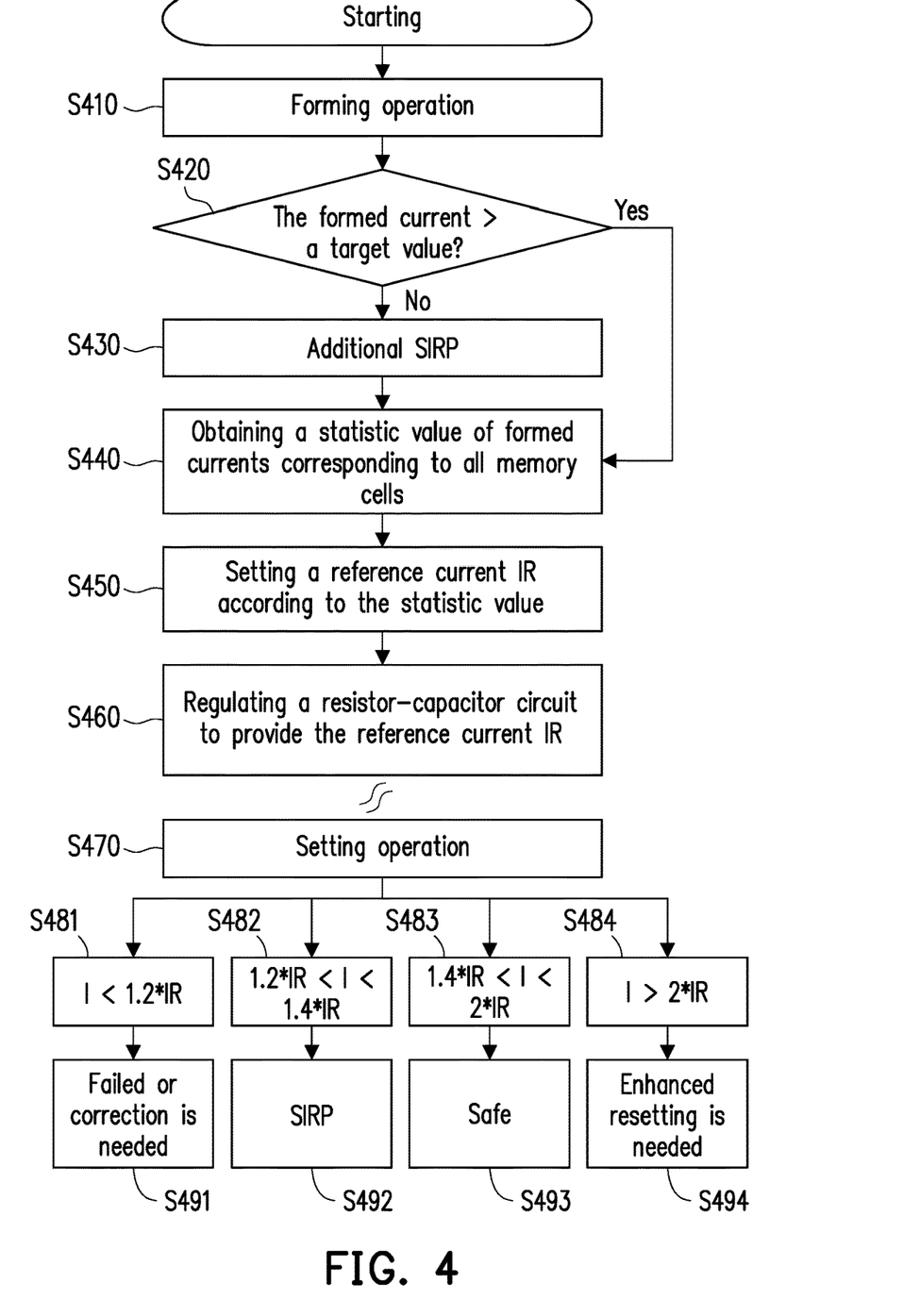
FIG. 4 shows a schematic diagram of an implementation of a reliability enhancement method of an embodiment of the invention.

Referring to FIG. 4 hereafter, FIG. 4 shows a schematic diagram of an implementation of a reliability enhancement method of an embodiment of the invention. In step S410, a forming operation is performed on all memory cells in a memory array. Then, in step S420, whether a formed current of the memory cells completing the forming operation is greater than a target value or not is judged. If a judging result is Yes, step S440 is performed. Oppositely, if the judging result is No, step S430 is performed.

The above target value is used to judge whether the memory cells have smoothly completed the forming operation or not. When the forming operation of the memory cells is not completed, an additional SIRP operation may be performed through step S430 to further decrease the resistance value of the memory cells.

In step S440, a statistic value (such as a maximum value, an average value and a median) of the formed currents corresponding to all memory cells is obtained, and a reference current IR (step S450) is set according to the statistic value. Then, a resistor-capacitor circuit may be regulated through step S460. The resistor-capacitor circuit is enabled to provide a status of the reference current IR. Through illustration in detail, the resistor-capacitor circuit may receive a constant bias voltage, and generate a current according to the provided resistance value. When the reference current IR is set, the embodiment of the invention may regulate the resistance value provided by the resistor-capacitor circuit through a trimming measure, and enable the current provided by the resistor-capacitor circuit just to be equal to the reference current IR.

Of course, a regulating mechanism of the resistance value of the above resistor-capacitor circuit may also be completed in a digital mode. Therefore, the current generated by the resistor-capacitor circuit may have an inevitable error with the reference current IR. In practical operation, the current generated by the resistor-capacitor circuit only needs to be substantially equal to the reference current IR, and does no need to be completely identical. In the embodiment of the invention, the current generated by the resistor-capacitor circuit may be a little greater than the reference current IR.

Additionally, the above resistor-capacitor circuit may be additionally disposed outside a memory cell array, and one memory cell in the memory cell array may be selected for implementation.

Then, a setting operation is performed on the memory cells in step S470, and a set current I of the memory cells is read. When the set current I<1.2*reference current IR (step S481), step S491 is performed to mark the memory cells as defective memory cells, a fix operation such as backup memory cell replacement or error correction needs to be performed, or the memory cells are set as failed. When 1.2*reference current IR≤set current I<1.4*reference current IR (step S482), step S492 is performed to mark the memory cells as dangerous memory cells, and a fix operation of an additional SIRP operation needs to be performed. When 1.4*reference current IR≤set current I<2*reference current IR (step S483), step S493 is performed to mark the memory cells as safe memory cells. When the set current I≤2*reference current IR (step S484), step S494 is performed to record the memory cells as excessively set memory cells.

Figure 5:
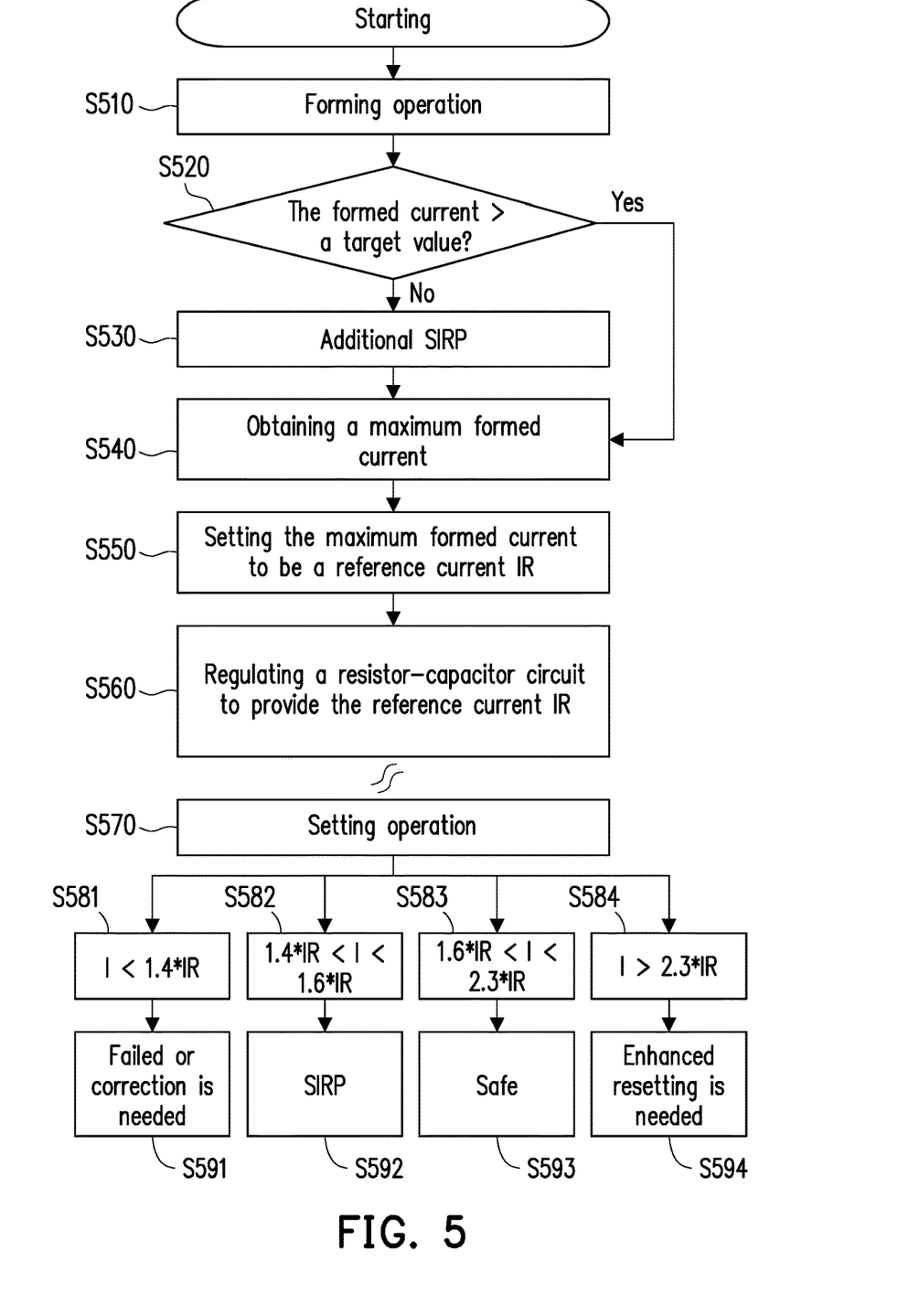
FIG. 5 shows a schematic diagram of another implementation of a reliability enhancement method of an embodiment of the invention.

Referring to FIG. 5, FIG. 5 shows a schematic diagram of another implementation of a reliability enhancement method of an embodiment of the invention. In the present embodiment, operation details of steps S510-S530 and steps S550-S570 are identical to the above implementation, and the descriptions thereof are omitted herein. It is worth noting that in step S540, the present implementation only judges the formed current of parts of memory cells in a memory cell array to obtain the statistic value of the formed current. In the present implementation, one selected memory cell in each memory cell row may be selected from a plurality of memory cell rows of the memory cell array to calculate the statistic value of the formed current. Additionally, each selected memory cell respectively corresponds to a plurality of different memory columns in the memory cell array.

In short, a plurality of memory cells in the memory cell array can be selected as the selected memory cells in a layout position diagonal line mode. Of course, the embodiments of the invention are not limited thereto.

In the present embodiment, not all memory cells are selected to perform the setting operation of the reference current, so that in steps S581-S584, setting of the ratio relationship between the set current I and the reference current IR is strict. In step S581, whether the set current I is smaller than 1.4*reference current IR or not is judged. In step S582, whether the set current I is greater than or equal to 1.4*reference current IR but smaller than 1.6*reference current IR or not is judged. In step S583, whether the set current I is greater than or equal to 1.6*reference current IR but smaller than 2.3*reference current IR or not is judged. In step S584, whether the set current I is greater than or equal to 2.3*reference current IR or not is judged. In steps S591-S594, a recording operation of the physical status of the memory cells is performed respectively corresponding to judging results in steps S581-S584. Details of steps S581-S584 are similar to those of steps S491-S494, and the descriptions thereof are omitted herein.

Of course, in FIG. 4 and FIG. 5, a ratio relationship between the set current I and the reference current IR may be regulated according to practical electric characteristics of the resistive memory.

Incidentally, it is mentioned that setting of the reference values in implementations of FIG. 4 and FIG. 5 may be performed through a plurality of resistor-capacitor circuits. By taking FIG. 4 as an example, a first resistor-capacitor circuit may be configured to generate a current of 1.2*reference current IR, a second resistor-capacitor circuit may be configured to generate a current of 1.4*reference current IR, and a third resistor-capacitor circuit may be configured to generate a current of 2*reference current IR. The resistor-capacitor circuits may regulate the magnitude of the generated current through a trimming measure after the reference current IR is set. Of course, the first resistor-capacitor circuit to the third resistor-capacitor circuit may be circuits disposed outside the memory cell array, and may also be a plurality of memory cells in the memory cell array.

Figure 6:
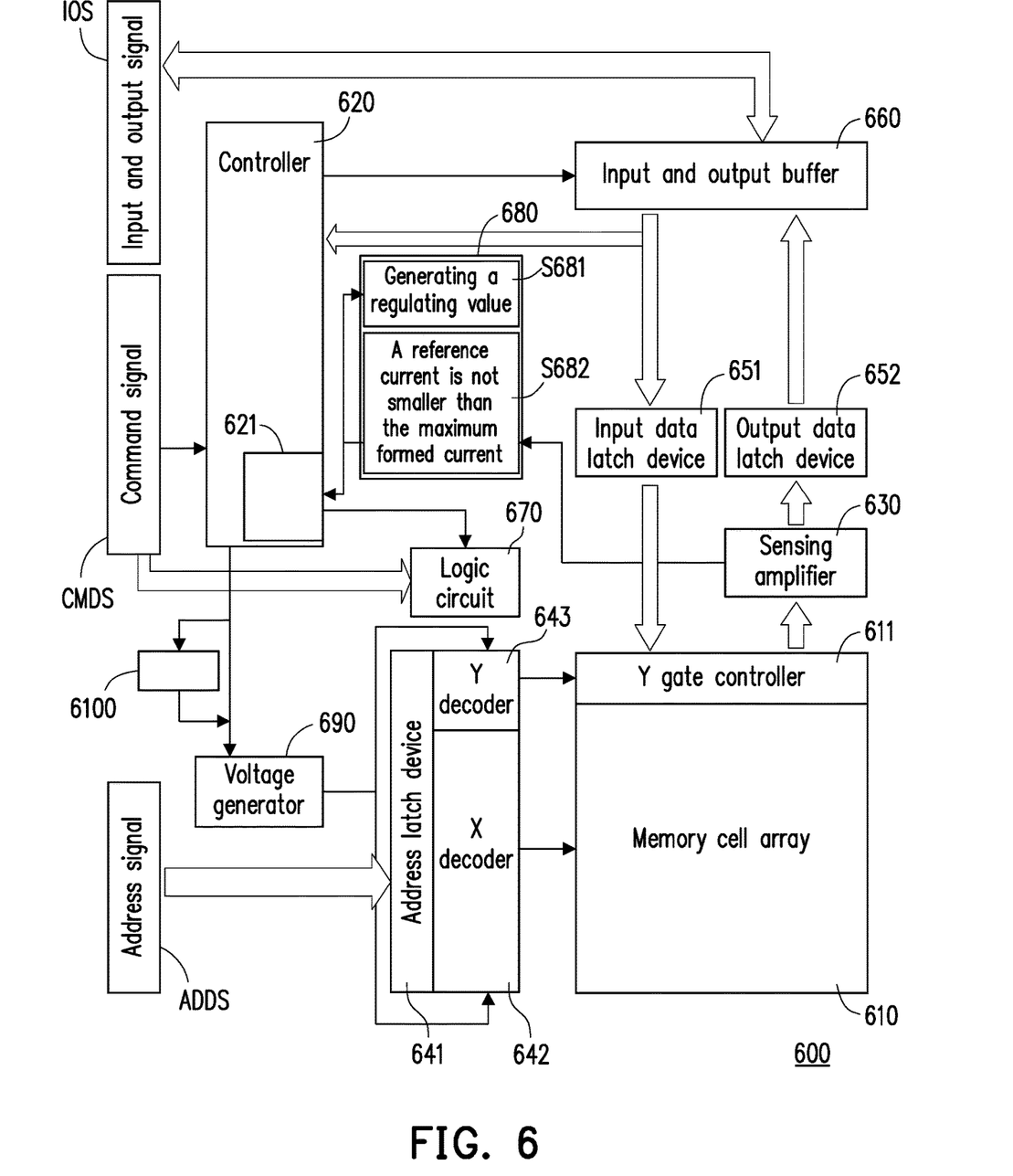
FIG. 6 shows a schematic diagram of a memory device of an embodiment of the invention.

Referring to FIG. 6, FIG. 6 shows a schematic diagram of a memory device of an embodiment of the invention. The memory device 600 includes a memory cell array 610, a controller 620, a sensing amplifier 630, an address latch device 641, an X decoder 642, a Y decoder 643, an input data latch device 651, an output data latch device 652, an input and output buffer 660, logic circuits 670 and 680, a voltage generator 690 and a bias lookup table 6100. The memory cell array 610 includes a plurality of memory cells. In the present embodiment, the memory cells are resistive memory cells. The memory cell array 610 includes a Y gate controller 611 to control input of an address signal in a direction Y. The memory cell array 610 is coupled to the X decoder 642 and the Y decoder 643 to respectively receive address information in directions X and Y after decoding. The X decoder 642 and the Y decoder 643 are coupled to the address latch device 641. The address latch device 641 is configured to retain address information ADDS. Additionally, the logic circuit 670 is configured to control whether the address latch device 641, the X decoder 642 and the Y decoder 643 are started or not, and to determine whether the memory cell array 610 can be accessed or not.

The memory cell array 610 is additionally coupled to the sensing amplifier 630. The sensing amplifier 630 is configured to sense a reading current of the memory cells and obtain output data. The input data latch device 651 and the output data latch device 652 respectively latch write data and output data of the memory cells. The input and output buffer 660 temporarily retains the above write data and the output data, and is configured to receive or provide an input and output signal IOS.

It is worth noting that the controller 620 may receive the formed currents of the memory cells sensed by the sensing amplifier 630 through the logic circuit 680, and calculates a statistic value (such as a maximum value, an average value and a median) of the formed currents to set the reference current. In the present embodiment, for example, the maximum value of the formed currents is used to set the reference current. The controller 620 includes a regulating signal generator 621. The regulating signal generator 621 may generate a regulating signal according to the statistic value of the formed currents. The logic circuit 680 is configured to perform steps S681 and S682. The logic circuit 680 receives the above regulating signal, and performs a generating operation of a regulating value of a formed voltage and a set voltage according to the regulating signal in step S681. The logic circuit 680 may regulate the resistor-capacitor circuit (not shown) according to the above regulating value to generate the reference current. The logic circuit 680 judges whether the reference current generated by the resistor-capacitor circuit is not smaller than the statistic value of the formed current or not in step S682, and thereby completes the setting operation of the reference current.

When a comparison operation of the set current is performed, by using the reference current IR1 set according to the statistic value (for example, the maximum value) of the formed current as the basis, the controller 620 may enable a plurality of resistor-capacitor circuits to respectively generate a plurality of reference currents IRAx according to a plurality of reference values. The reference currents IRAx may be provided to the sensing amplifier 630 at the same time to be compared with the set current of the memory cells. The set current of the memory cells is judged to be located in one of a plurality of intervals formed by the plurality of set reference currents IRAx. Therefore, the physical status of the memory cells is judged.

Additionally, the controller 620 is coupled to the bias lookup table 6100, and enables the bias lookup table 6100 to provide a bias set value, so that the voltage generator 690 generates a corresponding reset voltage or set voltage.

The controller 620 further receives a command signal CMDS to perform various access operations relevant to the memory cell array 610.

The controller 620 of the present embodiment of the invention may be a processor with operational capability, or the controller 620 may be a hardware circuit designed through a hardware description language (HDL) or any other digital circuit design modes well known to those ordinarily skilled in the art, and realized in a mode through a field programmable gate array (FPGA), a complex programmable logic device (CPLD) or an application-specific integrated circuit (ASIC).

Based on the above, the invention calculates ratios of the set current of the memory cells to the maximum value of the formed currents. Additionally, the physical status of each of the memory cells is judged according to the ratios. Therefore, a subsequent fix operation may be performed on the physical status of each of the memory cells, and the reliability of the memory cells can be effectively enhanced.

What is claimed is:

1. A reliability enhancement method applicable to a resistive memory device, the method comprising:
    performing a forming operation on a plurality of memory cells;
    reading the formed memory cells to respectively obtain a plurality of formed currents;
    setting a reference current according to a statistic value of the formed currents;
    performing a setting operation on the memory cells;
    calculating a ratio between a set current of each of the memory cells and the reference current, and judging a physical status of each of the memory cells according to the ratio; and
    determining whether to perform a fix operation of each of the memory cells or not according to the physical status of each of the memory cells.

2. The reliability enhancement method according to claim 1, wherein the step of calculating the ratio between the set current of each of the memory cells and the reference current, and judging the physical status of each of the memory cells according to the ratio comprises:
    setting a plurality of different reference values according to the reference current, and comparing the ratio with the reference values to obtain the physical status of each of the memory cells.

3. The reliability enhancement method according to claim 2, wherein the step of determining whether to perform the fix operation of each of the memory cells or not according to the physical status of each of the memory cells comprises:
    when the ratio is smaller than a first reference value, setting each of the corresponding memory cells as a first status, and performing a replacing operation on each of the memory cells or performing an error correction code operation on data retained in each of the memory cells to fix each of the memory cells, or setting each of the memory cells as failed;
    when the ratio is in a range of greater than or equal to the first reference value to smaller than a second reference value, setting each of the corresponding memory cells as a second status, and performing a small insert reset pulse operation on each of the corresponding memory cells to fix each of the memory cells;
    when the ratio is in a range of greater than or equal to the second reference value to smaller than a third reference value, setting each of the corresponding memory cells as a third status, and skipping performing a fix operation on each of the memory cells; and
    when the ratio is greater than the third reference value, setting each of the corresponding memory cells as a fourth status, skipping performing a fix operation on each of the memory cells, and using an enhanced resetting operation when a resetting operation is performed on each of the memory cells,
    wherein the first reference value<the second reference value<the third reference value.

4. The reliability enhancement method according to claim 2, further comprising selecting all memory cells of a memory cell array as the memory cells.

5. The reliability enhancement method according to claim 4, wherein the reference values are respectively 1.2, 1.4 and 2.

6. The reliability enhancement method according to claim 2, further comprising:
    selecting one selected memory cell in each of memory cell rows among a plurality of memory cell rows of a memory cell array so as to obtain each of the memory cells,
    wherein the memory cells respectively correspond to a plurality of different memory columns in the memory cell array.

7. The reliability enhancement method according to claim 6, wherein the reference values are respectively 1.4, 1.6 and 2.3.

8. The reliability enhancement method according to claim 1, further comprising:
    providing a resistor-capacitor circuit, and regulating an impedance value provided by the resistor-capacitor circuit to record the reference current.

9. The reliability enhancement method according to claim 1, further comprising:
    providing a first reference memory cell to record the reference current.

10. The reliability enhancement method according to claim 7, further comprising:
    providing a plurality of second reference memory cells to respectively record a plurality of products generated by the reference current and the plurality of reference values.

11. A resistive memory device comprising:
    a memory cell array comprising a plurality of memory cells;
    a sensing amplifier coupled to the memory cell array; and
    a controller coupled to the sensing amplifier and configured to:
        perform a forming operation on the memory cells;
        enable the sensing amplifier to read the formed memory cells to respectively obtain a plurality of formed currents;
        set a first reference current according to a statistic value of the formed currents;
        perform a setting operation on the memory cells;
        enable the sensing amplifier to calculate a ratio between a set current of each of the memory cells and the first reference current, wherein the controller judges a physical status of each of the memory cells according to the ratio; and determine whether to perform a fix operation of each of the memory cells or not according to the physical status of each of the memory cells.

12. The resistive memory device according to claim 11, further comprising:

a reference current generator coupled to the controller and the sensing amplifier, wherein the controller provides a regulating signal according to the statistic value of the formed currents so that the reference current generator provides the first reference current according to the regulating signal.

13. The resistive memory device according to claim 12, wherein the reference current generator further generates a plurality of second reference currents according to the first reference current and a plurality of reference values according to the first reference current, and the sensing amplifier compares the set current of each of the memory cells with the second reference currents to judge the physical status of each of the memory cells.

14. The resistive memory device according to claim 12, wherein the reference current generator is a resistor-capacitor circuit.

* * * * *